(12) United States Patent
Miyano

(10) Patent No.: US 7,365,362 B2
(45) Date of Patent: Apr. 29, 2008

(54) SEMICONDUCTOR DEVICE AND METHOD OF FABRICATING SEMICONDUCTOR DEVICE USING OXIDATION

(75) Inventor: Kiyotaka Miyano, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 11/269,543

(22) Filed: Nov. 9, 2005

(65) Prior Publication Data
US 2006/0138555 A1    Jun. 29, 2006

(30) Foreign Application Priority Data
Nov. 9, 2004    (JP)    ............... 2004-325086

(51) Int. Cl.
*H01L 29/00* (2006.01)
*H01L 31/036* (2006.01)

(52) U.S. Cl. .................. 257/65; 438/431; 257/E29.297

(58) Field of Classification Search ................... 257/19, 257/65, E29.297
See application file for complete search history.

(56) References Cited

U.S. PATENT DOCUMENTS

| | | | | |
|---|---|---|---|---|
| 6,600,212 | B2 * | 7/2003 | Takayanagi et al. | 257/616 |
| 6,821,825 | B2 * | 11/2004 | Todd et al. | 438/150 |
| 7,233,035 | B2 * | 6/2007 | Rotondaro et al. | 257/274 |
| 2002/0113294 | A1 * | 8/2002 | Rhee et al. | 257/616 |
| 2003/0201461 | A1 * | 10/2003 | Sato et al. | 257/197 |
| 2004/0161875 | A1 * | 8/2004 | Chu et al. | 438/105 |
| 2005/0161711 | A1 * | 7/2005 | Chu | 257/288 |
| 2006/0113542 | A1 * | 6/2006 | Isaacson et al. | 257/65 |
| 2006/0151787 | A1 * | 7/2006 | Chen et al. | 257/65 |

FOREIGN PATENT DOCUMENTS

JP    2002-343881    11/2002

* cited by examiner

*Primary Examiner*—W. David Coleman
(74) *Attorney, Agent, or Firm*—Finnegan, Henderson, Farabow, Garrett & Dunner, L.L.P.

(57) ABSTRACT

According to one aspect of the invention, there is provided a semiconductor device fabrication method comprising:
  forming a gate insulating film on a semiconductor substrate;
  forming a film containing a predetermined semiconductor material and germanium on the gate insulating film;
  oxidizing the film to form a first film having a germanium concentration higher than that of the film and a film thickness smaller than that of the film on the gate insulating film, and form an oxide film on the first film;
  removing the oxide film;
  forming, on the first film, a second film containing the semiconductor material and having a germanium concentration lower than that of the first film;
  forming a gate electrode by etching the second and first films; and
  forming a source region and drain region by ion-implanting a predetermined impurity by using the gate electrode as a mask.

11 Claims, 7 Drawing Sheets

SEMICONDUCTOR DEVICE AND METHOD OF FABRICATING SEMICONDUCTOR DEVICE USING OXIDATION

CROSS REFERENCE TO RELATED APPLICATION

This application is based upon and claims benefit of priority under 35 USC §119 from the Japanese Patent Application No. 2004-325086, filed on Nov. 9, 2004, the entire contents of which are incorporated herein by reference.

BACKGROUND OF THE INVENTION

The present invention relates to a semiconductor device and a method of fabricating the same.

Recently, the use of silicon germanium (SiGe) obtained by adding germanium (Ge) to silicon (Si) as a gate electrode material of a P-channel MOS transistor (to be referred to as a PMOSFET hereinafter) is proposed. This makes it possible to increase the activation ratio (the ratio of activated impurity atoms to all doped impurity atoms) of boron (B) as a P-type dopant, and thereby decrease the thickness of a depletion layer formed near the interface of the gate electrode and suppress depletion of the gate electrode.

In the surface portion of the gate electrode, a silicide for reducing the parasitic resistance is formed. Since silicon germanium (SiGe) does not well match a silicide made of cobalt (Co) or nickel (Ni), the resistance of the silicide increases. Therefore, a method is proposed by which a silicon (Si) film as a silicide reaction layer to be reacted with a silicide is formed on a silicon germanium (SiGe) film, thereby forming a stacked structure of the silicon germanium (SiGe) film and silicon (Si) film as a gate electrode.

If, however, predetermined annealing is performed after the silicon germanium (SiGe) film and silicon (Si) film are formed, germanium (Ge) in the silicon germanium (SiGe) film diffuses in the silicon (Si) film as an upper layer. If the germanium (Ge) concentration in the silicon (Si) film as an upper layer exceeds about 5 at %, the resistance of a silicide to be formed later undesirably increases. Note that at % represents an atomic composition ratio.

To prevent germanium (Ge) in the silicon germanium (SiGe) film from diffusing in the silicon (Si) film as an upper layer, therefore, the germanium (Ge) concentration in the silicon germanium (SiGe) film as a lower layer is desirably as low as possible, and the film thickness is desirably as small as possible.

Unfortunately, in a PMOSFET, to suppress depletion of the gate electrode by increasing the activation ratio of ion-implanted boron, it is necessary to increase the germanium (Ge) concentration in the silicon germanium (SiGe) film. Accordingly, the formation of a silicon germanium (SiGe) film having a low germanium (Ge) concentration causes depletion of the gate electrode, and makes it difficult to improve the drivability of the transistor.

If, therefore, a silicon germanium (SiGe) film having a high germanium (Ge) concentration and a small film thickness is formed near the interface with a gate insulating film, it is possible to prevent an increase in resistance of the silicide because the amount of germanium (Ge) which diffuses in the silicon (Si) film as an upper layer reduces. In addition, depletion of the gate electrode can be suppressed since the activation ratio of boron increases.

Unfortunately, a silicon germanium (SiGe) film having a high germanium (Ge) concentration and a small film thickness readily causes migration because the melting point of germanium (Ge) is as low as about 945° C. As a consequence, a large number of projections and recesses are formed on the film surface, and this worsens the morphology (the surface state).

By contrast, when silicon germanium (SiGe) is used as the gate electrode material in an N-channel MOS transistor (to be referred to as an NMOSFET hereinafter), the activation ratio of phosphorus (P) or arsenic (As) as an N-type dopant decreases.

Accordingly, to form a complementary MOS transistor (to be referred to as a CMOSFET hereinafter) made up of a PMOSFET and NMOSFET, it is desirable to form a stacked structure of a silicon germanium (SiGe) film and silicon (Si) film as a gate electrode of the PMOSFET, and form only a silicon (Si) film as a gate electrode of the NMOSFET.

If, however, a silicon germanium (SiGe) film having a high germanium (Ge) concentration and a small film thickness is formed, the morphology worsens, so a silicon germanium (SiGe) film having a high germanium (Ge) concentration and a large film thickness must be formed below the gate electrode of the PMOSFET. In this case, the heights of the gate electrodes of the PMOSFET and NMOSFET are largely different, and this makes the formation of these gate electrodes impossible.

A reference concerning a MOSFET which uses silicon germanium (SiGe) as the gate electrode material is as follows.

Reference 1: Japanese Patent Laid-Open No. 2002-343881

SUMMARY OF THE INVENTION

According to one aspect of the present invention, there is provided a semiconductor device fabrication method comprising:

forming a gate insulating film on a semiconductor substrate;

forming a film containing a predetermined semiconductor material and germanium on the gate insulating film;

oxidizing the film to form a first film having a germanium concentration higher than that of the film and a film thickness smaller than that of the film on the gate insulating film, and form an oxide film on the first film;

removing the oxide film;

forming, on the first film, a second film containing the semiconductor material and having a germanium concentration lower than that of the first film;

forming a gate electrode by etching the second and first films; and forming a source region and drain region by ion-implanting a predetermined impurity by using the gate electrode as a mask.

According to one aspect of the present invention, there is provided a semiconductor device comprising:

a gate insulating film selectively formed on a predetermined region of a semiconductor substrate;

a gate electrode comprising a first film formed on said gate insulating film and containing a predetermined semiconductor material and germanium, and a second film formed on said first film, containing the semiconductor material, and having a germanium concentration lower than that of said first film; and a source region and drain region formed in a surface portion of said semiconductor substrate on two sides of a channel region positioned below said gate electrode.

According to one aspect of the present invention, there is provided a semiconductor device fabrication method comprising:

forming a first-conductivity-type semiconductor region and second-conductivity-type semiconductor region in a surface portion of a semiconductor substrate;

forming a gate insulating film on the semiconductor substrate;

forming a film containing a predetermined semiconductor material and germanium on the gate insulating film;

oxidizing the film to form a first film having a germanium concentration higher than that of the film and a film thickness smaller than that of the film on the gate insulating film, and form an oxide film on the first film;

removing the oxide film;

forming a mask pattern having a pattern corresponding to the second-conductivity-type semiconductor region, and etching the first film by using the mask pattern, thereby removing the first film formed on the first-conductivity-type semiconductor region via the gate insulating film;

removing the mask pattern, and forming a second film containing the semiconductor material and having a germanium concentration lower than that of the first film, on the gate insulating film formed on the first-conductivity-type semiconductor region, and on the first film formed on the second-conductivity-type semiconductor region;

forming a first gate electrode by etching the second and first films formed on the second-conductivity-type semiconductor region, and forming a second gate electrode by etching the second film formed on the first-conductivity-type semiconductor region; and forming a first source region and first drain region by ion-implanting a first-conductivity-type impurity in the second-conductivity-type semiconductor region by using the first gate electrode as a mask, and forming a second source region and second drain region by ion-implanting a second-conductivity-type impurity in the first-conductivity-type semiconductor region by using the second gate electrode as a mask.

DETAILED DESCRIPTION OF THE INVENTION

Embodiments of the present invention will be described below with reference to the accompanying drawings.

(1) FIRST EMBODIMENT

Figure 1:
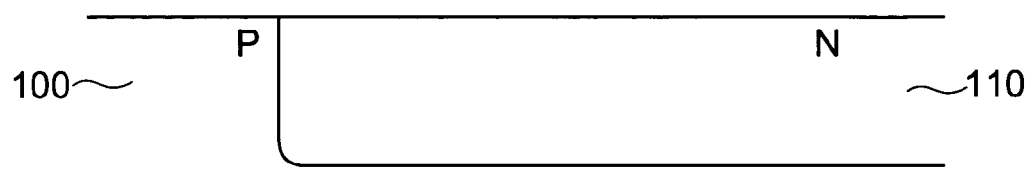
FIG. 1 is a longitudinal sectional view showing the sectional structure of a device in a process of a PMOSFET fabrication method according to the first embodiment of the present invention.

FIGS. 1 to 9 show a PMOSFET fabrication method according to the first embodiment of the present invention. First, as shown in FIG. 1, a desired resist pattern is formed on a p-type semiconductor substrate 10 by photolithography, and used as a mask to ion-implant phosphorus (P), arsenic (As), or antimony (Sb). After that, annealing is performed to form an N-type semiconductor region 110 about 1 µm deep.

Figure 2:
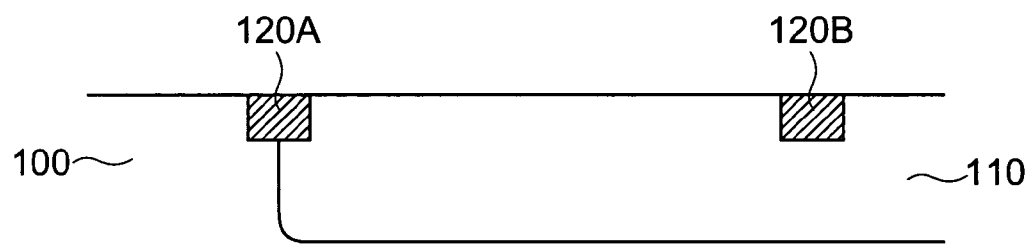
FIG. 2 is a longitudinal sectional view showing the sectional structure of a device in a process of the PMOSFET fabrication method.
Figure 3:
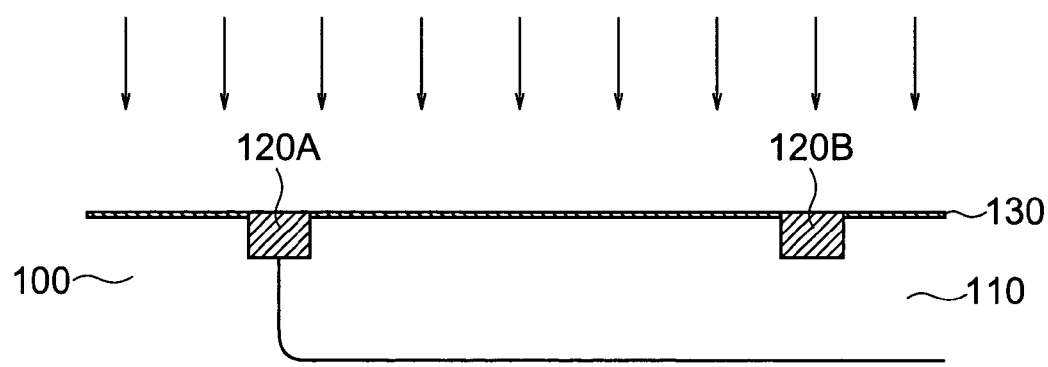
FIG. 3 is a longitudinal sectional view showing the sectional structure of a device in a process of the PMOSFET fabrication method.

As shown in FIG. 2, element isolation oxide films 120A and 120B about 400 nm thick are formed in desired regions on the semiconductor substrate 100. As shown in FIG. 3, a protective oxide film 130 about 8 nm thick is formed, and ion implantation for adjusting the gate threshold voltage of a PMOSFET is performed. After that, the protective oxide film 130 is removed.

Figure 4:
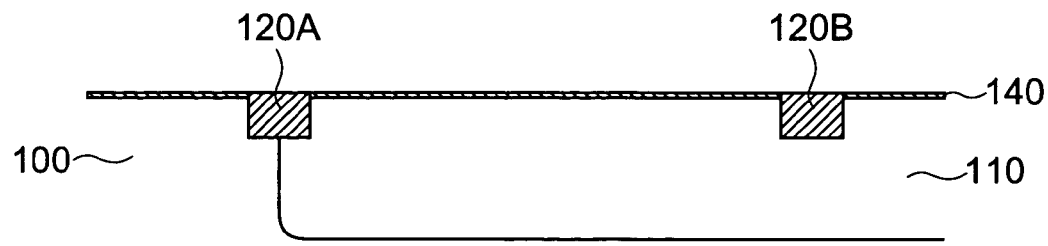
FIG. 4 is a longitudinal sectional view showing the sectional structure of a device in a process of the PMOSFET fabrication method.

As shown in FIG. 4, a gate insulating film 140 made of, e.g., a silicon oxide ($SiO_2$) film about a few nm thick is formed on the surface of the semiconductor substrate 100. Note that the gate insulating film 140 need not be a silicon oxide ($SiO_2$) film, and may also be, e.g., an oxynitride film containing 0 to about a few % of nitrogen, a high-dielectric material such as a tantalum oxide ($TaO_2$) film, a zirconium oxide ($ZrO_x$) film, or hafnium oxide ($HfO_x$) film (where x is a positive integer), or a silicate film of any of these materials.

Figure 5:
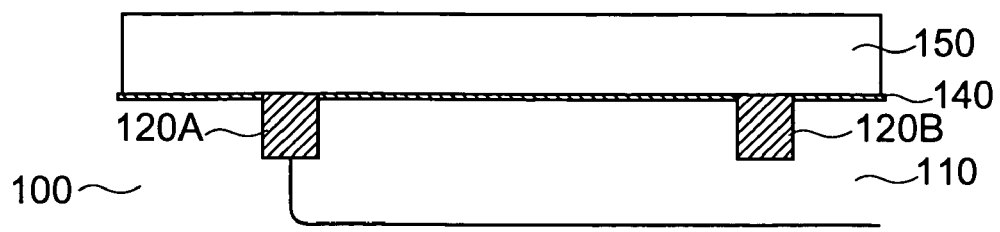
FIG. 5 is a longitudinal sectional view showing the sectional structure of a device in a process of the PMOSFET fabrication method.

As shown in FIG. 5, polysilicon germanium (SiGe) about 60 nm thick containing about 10 at % of germanium (Ge) is deposited on the gate insulating film 140 by using CVD (Chemical Vapor Deposition) or the like, thereby forming a polysilicon germanium (SiGe) film 150.

The morphology can be improved by thus forming the polysilicon germanium (SiGe) film 150 having a low germanium (Ge) concentration of about 10 at % and a large film thickness of about 60 nm.

Figure 6:
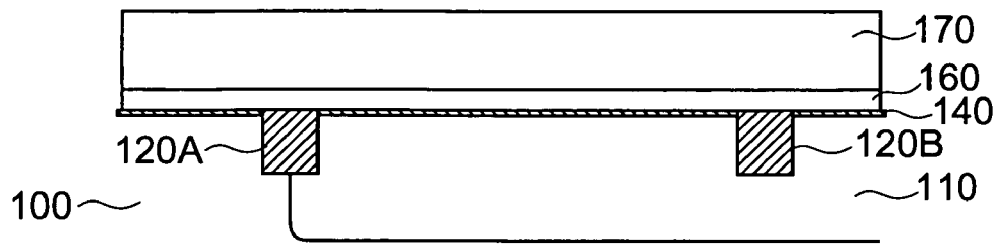
FIG. 6 is a longitudinal sectional view showing the sectional structure of a device in a process of the PMOSFET fabrication method.

As shown in FIG. 6, selective oxidation which produces silicon oxide ($SiO_2$) and produces no germanium oxide (GeOs) is performed by preferentially oxidizing silicon (Si) in the polysilicon germanium (SiGe) film 150.

When this silicon oxide ($SiO_2$) is produced, germanium (Ge) is pushed down and deposited on the gate insulating film by a so-called plowing effect. Consequently, a polysilicon germanium (SiGe) film 160 having a high germanium (Ge) concentration of 30 at % and a small film thickness of about 10 nm and a silicon oxide ($SiO_2$) film 170 about 80 nm thick are formed without deteriorating the morphology.

Note that to preferentially oxidize silicon (Si) in the polysilicon germanium (SiGe) film 150, selective oxidation is preferably performed by using a gas system containing both steam ($H_2O$) as an oxidizer and hydrogen ($H_2$) as a reducer, and setting a partial pressure ratio $P_{H2O}/P_{H2}$ of steam ($H_2O$) to hydrogen ($H_2$) and the temperature of the gas system within a desired range.

Figure 20:
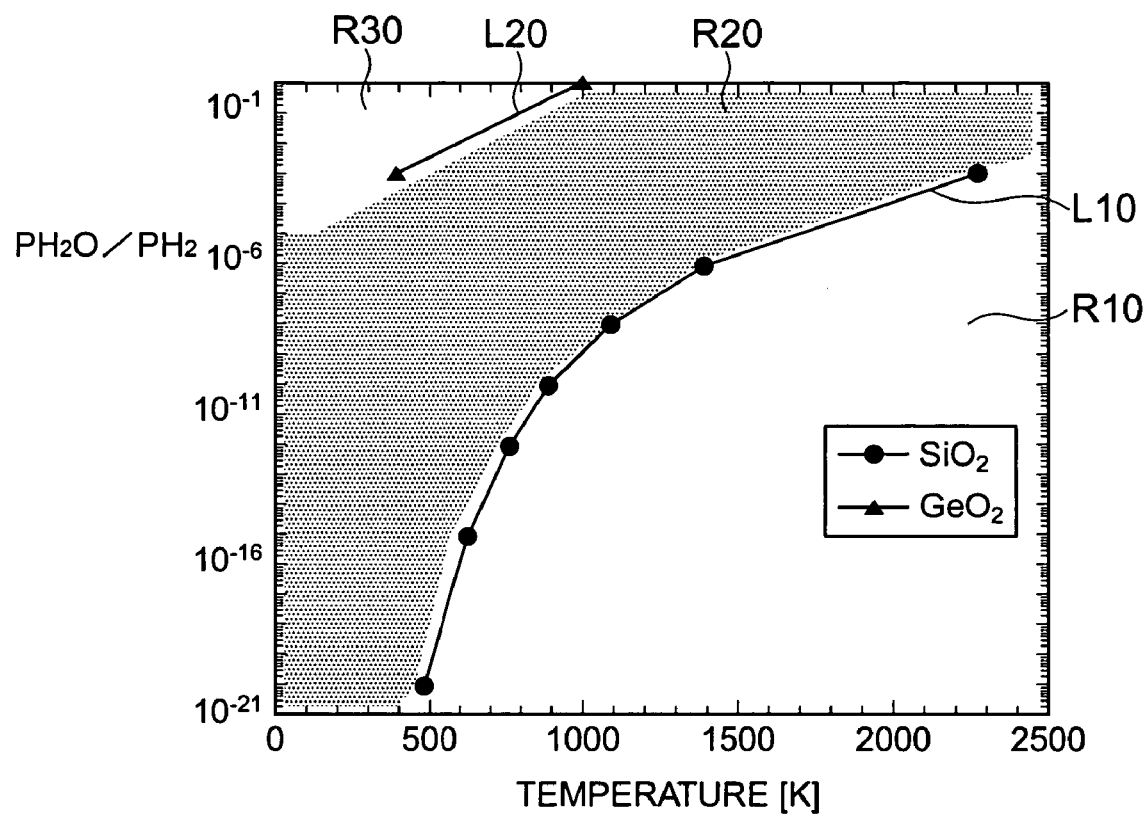
FIG. 20 is a graph showing the relationship between a partial pressure ratio $P_{H2O}/P_{H2}$ of steam to hydrogen in a gas system containing both steam and hydrogen, and the temperature of the gas system.

FIG. 20 shows the relationship between the partial pressure ratio $P_{H2O}/P_{H2}$ of steam ($H_2O$) to hydrogen ($H_2$) in the gas system containing both steam ($H_2O$) and hydrogen ($H_2$), and the temperature of the gas system. Referring to FIG. 20, a range R10 positioned below a curve L10 indicates a range over which neither silicon (Si) nor germanium (Ge) oxidizes, a range R20 positioned below a curve L20 and above the curve L10 indicates a range over which silicon (Si) oxidizes and germanium (Ge) does not oxidize, and a range R30 positioned above the curve L20 indicates a range over which both silicon (Si) and germanium (Ge) oxidize.

Accordingly, by setting the partial pressure ratio $P_{H2O}/P_{H2}$ of steam ($H_2O$) to hydrogen ($H_2$) and the temperature of the gas system within the range R20, silicon (Si) oxidizes, and germanium (Ge) does not oxidize, or, even if germanium (Ge) oxidizes, the oxide reduces and returns to germanium (Ge).

Note that the gas system containing both an oxidizer and reducer need only be a system containing at least one of steam ($H_2O$), carbon dioxide ($CO_2$), and oxygen ($O_2$) as an oxidizer, and at least one of hydrogen ($H_2$) and carbon monoxide (CO) as a reducer.

Note also that normal thermal oxidation may also be performed by setting the partial pressure ratio $P_{H2O}/P_{H2}$ of steam ($H_2O$) to hydrogen ($H_2$) and the temperature of the gas system within the range R30. In this case, the production amount of germanium oxide ($GeO_2$) slightly increases. Since, however, the oxidation rate of silicon (Si) is higher than that of germanium (Ge), it is possible to form, on the gate insulating film, a polysilicon germanium (SiGe) film having a high germanium (Ge) concentration and a small film thickness, as in the case of selective oxidation.

Figure 7:
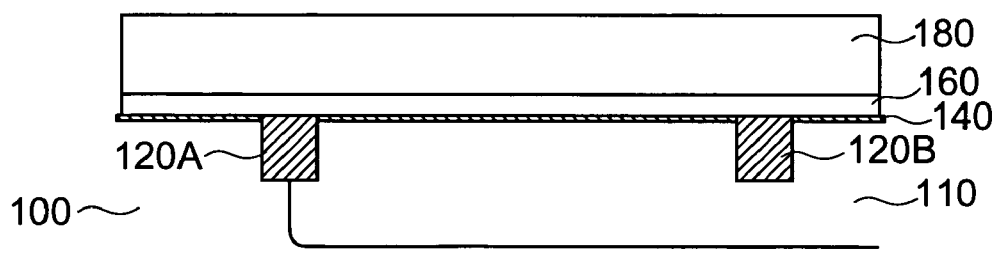
FIG. 7 is a longitudinal sectional view showing the sectional structure of a device in a process of the PMOSFET fabrication method.

Referring back to FIG. 6, the silicon oxide ($SiO_2$) film 170 is removed by, e.g., a dilute hydrofluoric acid solution. After that, as shown in FIG. 7, a polysilicon (Si) film 180 about 80 nm thick is formed by CVD or the like, thereby forming a stacked structure of the polysilicon germanium (SiGe) film 160 and polysilicon (Si) film 180.

Note that even when germanium (Ge) in the polysilicon germanium (SiGe) film 160 diffuses in its overlying film by annealing, if the germanium (Ge) concentration in this overlying film does not exceed about 5 at %, a polysilicon germanium (SiGe) film having a low germanium (Ge) concentration may also be formed on the polysilicon germanium (SiGe) film 160.

Figure 8:
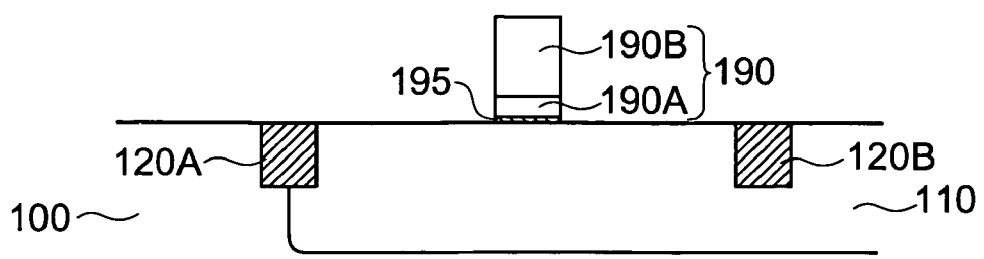
FIG. 8 is a longitudinal sectional view showing the sectional structure of a device in a process of the PMOSFET fabrication method.

As shown in FIG. 8, a photoresist step, RIE (Reactive Ion Etching) step, and the like are executed to form a gate electrode 190 made up of a polysilicon germanium (SiGe) film 190A and polysilicon (Si) film 190B and a gate insulating film 195.

Figure 9:
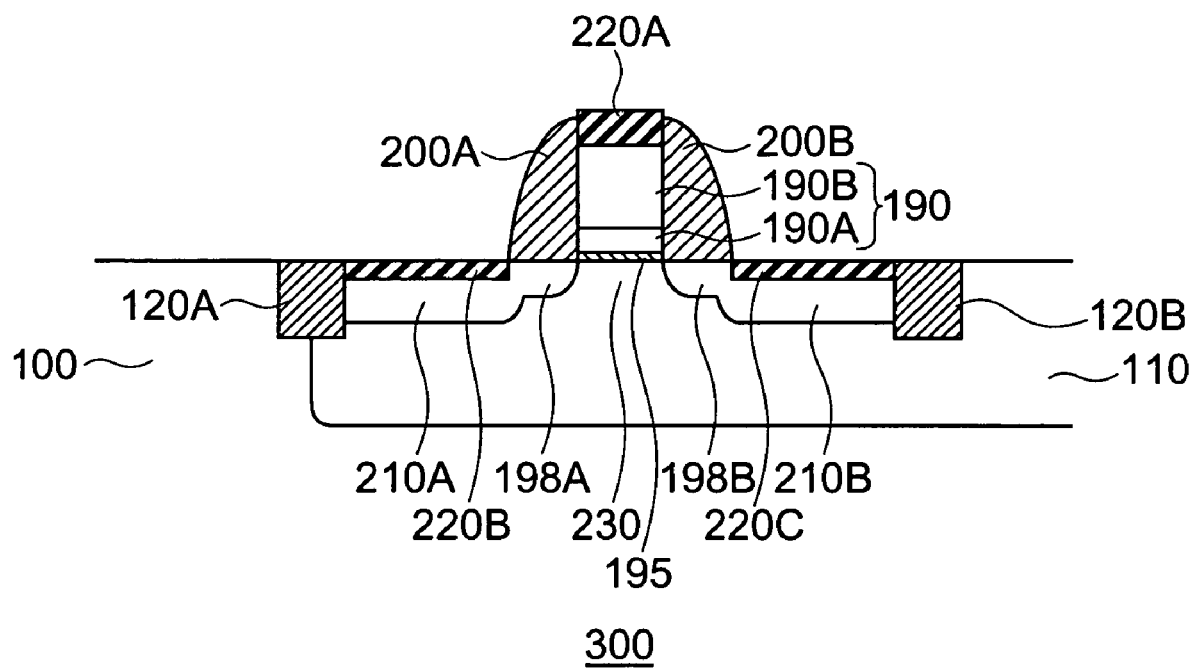
FIG. 9 is a longitudinal sectional view showing the sectional structure of a device in a process of the PMOSFET fabrication method.

As shown in FIG. 9, a P-type dopant such as boron (B), boron fluoride ($BF_2$), or indium (In) is ion-implanted, and the ion-implanted boron (B) is activated by predetermined annealing, thereby forming a lightly doped source extension region 198A and drain extension region 198B having shallow junctions.

After gate electrode side walls 200A and 200B are formed on the side surfaces of the gate electrode 190, a P-type dopant such as boron (B), boron fluoride ($BF_2$), or indium (In) is ion-implanted again. Subsequently, annealing which diffuses boron (B) is performed to activate the boron (B) which is ion-implanted into the gate electrode 190, and form a source region 210A and drain region 210B.

Then, a metal film made of, e.g., nickel (Ni) or platinum (pt) is formed by sputtering. After that, annealing is performed to form silicides 220A to 220C for reducing the parasitic resistance on the surface of the gate electrode 190 and in the surface portions of the source region 210A and drain region 210B.

Subsequently, an interlayer dielectric film (not shown) is formed, and an interconnection step is performed by forming a contact plug (not shown) in this interlayer dielectric film, thereby forming a PMOSFET 300.

As shown in FIG. 9, in the PMOSFET 300 fabricated by the above method, the element isolation oxide films 120A and 120B for element isolation are formed in the surface portion of the semiconductor substrate 100. Near the central portion of the element region isolated by the element isolation oxide films 120A and 120B, the gate electrode 190 made up of the polysilicon germanium (SiGe) film 190A and polysilicon (Si) film 190B is formed via the gate insulating film 195 formed on the surface of the semiconductor substrate 100.

On the side surfaces of the gate electrode 190, the gate electrode side walls 200A and 200B as insulating films are formed. Also, a channel region 230 in which an electric current flows is formed near the surface of the semiconductor substrate 100 below the gate electrode 190.

The source region 210A is formed between the channel region 230 and element isolation oxide film 120A, and the drain region 210B is formed between the channel region 230 and element isolation oxide film 120B.

Furthermore, the suicides 220A to 220C for reducing the parasitic resistance are formed on the surface of the gate electrode 190 and on the surfaces of the source region 210A and drain region 210B.

In this embodiment as described above, the polysilicon germanium (SiGe) film 150 having a low germanium (Ge) concentration and a large film thickness is formed such that the morphology is uniform, and then silicon (Si) in the polysilicon germanium (SiGe) film 150 is preferentially oxidized. Consequently, the polysilicon germanium (SiGe) film 160 having a high germanium (Ge) concentration and a small film thickness can be formed with a good morphology on the gate insulating film 140.

This makes it possible to reduce the amount of germanium (Ge) in the polysilicon germanium (SiGe) film 190A, which diffuses in the polysilicon (Si) film 190B, thereby preventing an increase in resistance of the silicide 220A. In addition, depletion of the gate electrode 190 can be suppressed by increasing the activation ratio of boron (B).

(2) SECOND EMBODIMENT

FIGS. 10 to 19 show a CMOSFET fabrication method according to the second embodiment of the present invention. First, a desired resist pattern is formed on a semiconductor substrate 400 by photolithography, and used as a mask to ion-implant boron (B), gallium (Ga), or indium (In).

Figure 10:
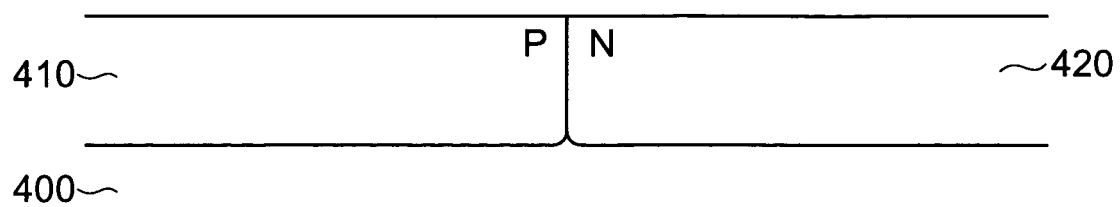
FIG. 10 is a longitudinal sectional view showing the sectional structure of a device in a process of a CMOSFET fabrication method according to the second embodiment of the present invention.

Similarly, a desired resist pattern is formed on the semiconductor substrate 400 by photolithography, and used as a mask to ion-implant phosphorus (P), arsenic (As), or antimony (Sb). After that, as shown in FIG. 10, annealing is performed to form a P-type semiconductor region 410 and N-type semiconductor region 420 about 1 μm deep.

Figure 11:
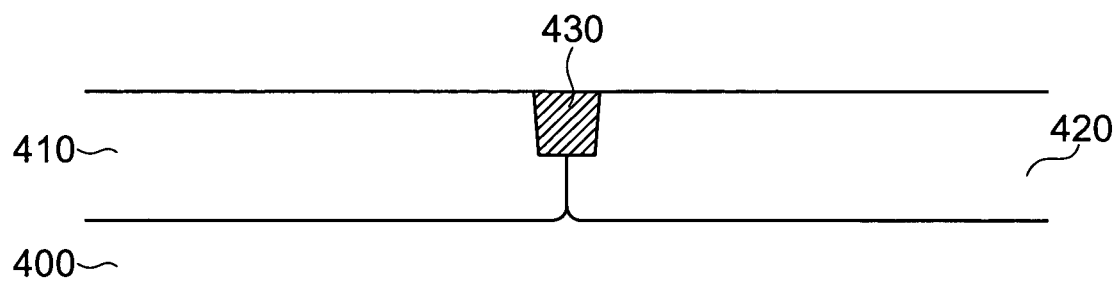
FIG. 11 is a longitudinal sectional view showing the sectional structure of a device in a process of the CMOSFET fabrication method.
Figure 12:
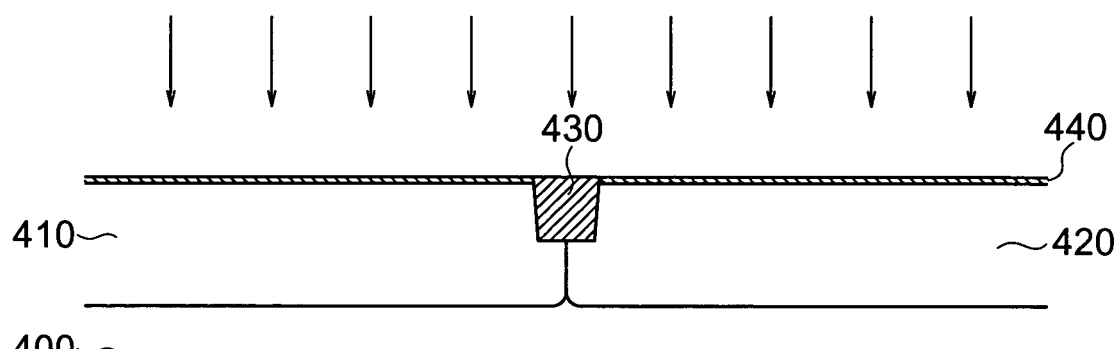
FIG. 12 is a longitudinal sectional view showing the sectional structure of a device in a process of the CMOSFET fabrication method.

As shown in FIG. 11, an element isolation oxide film 430 about 400 nm thick are formed in a desired region on the semiconductor substrate 400. As shown in FIG. 12, a protective oxide film 440 about 10 nm thick is formed, and ion implantation for adjusting the gate threshold voltage is performed. After that, the protective oxide film 440 is removed.

Figure 13:
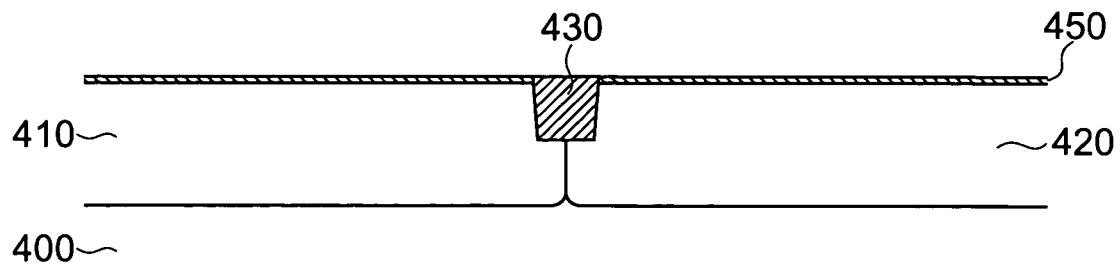
FIG. 13 is a longitudinal sectional view showing the sectional structure of a device in a process of the CMOSFET fabrication method.

As shown in FIG. 13, a gate insulating film 450 made of, e.g., a silicon oxide ($SiO_2$) film about a few nm thick is formed on the surface of the semiconductor substrate 400. Note that the gate insulating film 450 need not be a silicon oxide ($SiO_2$) film, and may also be, e.g., an oxynitride film containing 0 to about a few % of nitrogen, a high-k material such as a tantalum oxide ($TaO_2$) film, zirconium oxide ($ZrO_x$) film, or hafnium oxide ($HfO_x$) film (where x is a positive integer), or a silicate film of any of these materials.

Figure 14:
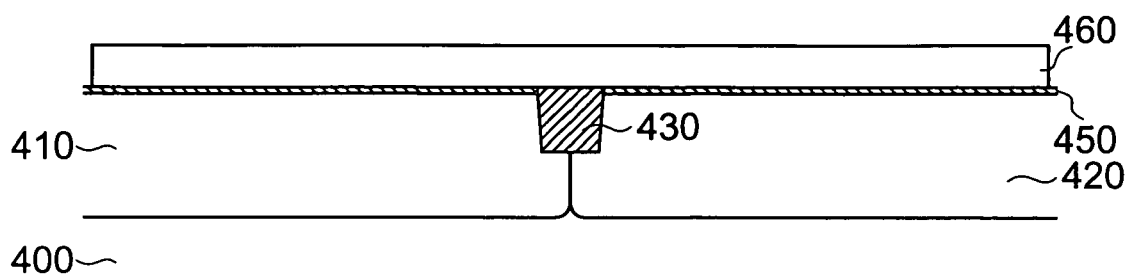
FIG. 14 is a longitudinal sectional view showing the sectional structure of a device in a process of the CMOSFET fabrication method.

As shown in FIG. 14, CVD (Chemical Vapor Deposition) or the like is used to deposit, on the gate insulating film 450, seed silicon (Si) (not shown) about a few nm thick and polysilicon germanium (SiGe) about 30 nm thick containing about 10 at % of germanium (Ge), thereby forming a polysilicon germanium (SiGe) film 460.

The morphology can be improved by thus forming the polysilicon germanium (SiGe) film 460 having a low germanium (Ge) concentration of about 10 at % and a large film thickness of about 30 nm.

Figure 15:
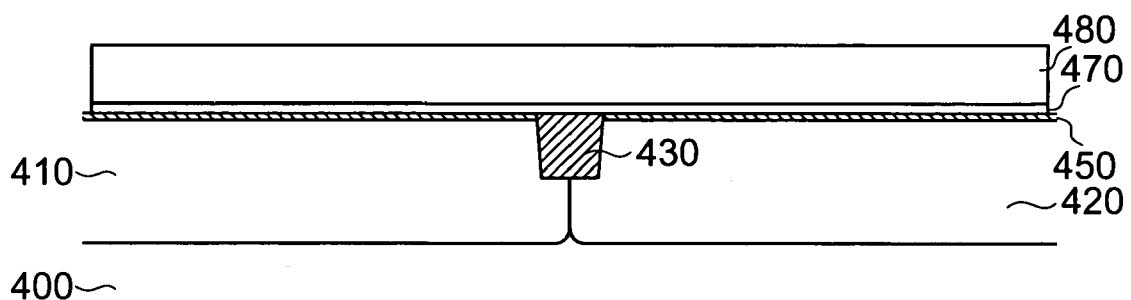
FIG. 15 is a longitudinal sectional view showing the sectional structure of a device in a process of the CMOSFET fabrication method.

As shown in FIG. 15, as in the first embodiment, selective oxidation which produces silicon oxide ($SiO_2$) and produces no germanium oxide (GeOs) is performed by preferentially oxidizing silicon (Si) in the polysilicon germanium (SiGe) film 460.

When this silicon oxide ($SiO_2$) is produced, germanium (Ge) is pushed down and deposited on the gate insulating film 450 by a so-called plowing effect. Consequently, a polysilicon germanium (SiGe) film 470 having a high germanium (Ge) concentration of 30 at % and a small film thickness of about 10 nm and a silicon oxide ($SiO_2$) film 480 about 40 nm thick are formed without deteriorating the morphology.

Note that to preferentially oxidize silicon (Si) in the polysilicon germanium (SiGe) film 460, as in the first embodiment, selective oxidation is preferably performed by using a gas system containing both steam ($H_2O$) as an oxidizer and hydrogen ($H_2$) as a reducer, and setting a partial pressure ratio $P_{H2O}/P_{H2}$ of steam ($H_2O$) to hydrogen ($H_2$) and the temperature of the gas system within the range R20 shown in FIG. 20. Note that normal thermal oxidation may also be performed by setting the partial pressure ratio $P_{H2O}/P_{H2}$ of steam ($H_2O$) to hydrogen ($H_2$) and the temperature of the gas system within the range R30.

Figure 16:
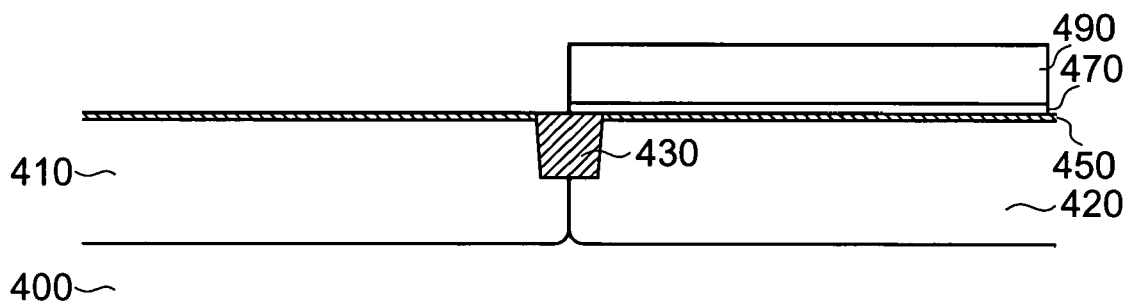
FIG. 16 is a longitudinal sectional view showing the sectional structure of a device in a process of the CMOSFET fabrication method.

Referring back to FIG. 15, the silicon oxide ($SiO_2$) film 480 is removed by, e.g., a dilute hydrofluoric acid solution. After that, as shown in FIG. 16, a photoresist 490 having a pattern corresponding to the N-type semiconductor region 420 is formed and used as a mask to etch the polysilicon germanium (SiGe) film 470 by using a predetermined alkali-based solution, thereby removing the polysilicon germanium (SiGe) film 470 positioned on the P-type semiconductor region 410.

Figure 17:
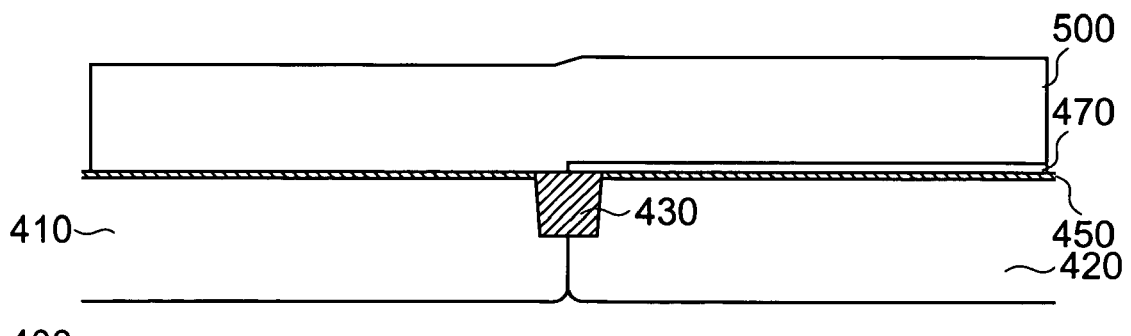
FIG. 17 is a longitudinal sectional view showing the sectional structure of a device in a process of the CMOSFET fabrication method.

As shown in FIG. 17, the photoresist 490 is removed, and a polysilicon (Si) film 500 about 100 nm thick is formed by CVD or the like. In this manner, on the N-type semiconductor region 420 where a PMOSFET is to be formed, a stacked structure of the polysilicon germanium (SiGe) film 470 having a germanium (Ge) concentration of 30 at % and a film thickness of about 10 nm and the polysilicon (Si) film 500 about 100 nm thick is formed. On the other hand, only the polysilicon (Si) film 500 about 100 nm thick is formed on the P-type semiconductor region 410 where an NMOSFET is to be formed.

Note that even when germanium (Ge) in the polysilicon germanium (SiGe) film 470 diffuses in its overlying film by annealing, if the germanium (Ge) concentration in this overlying film does not exceed about 5 at %, a polysilicon germanium (SiGe) film having a low germanium (Ge) concentration may also be formed instead of the polysilicon (Si) film 500.

Figure 18:
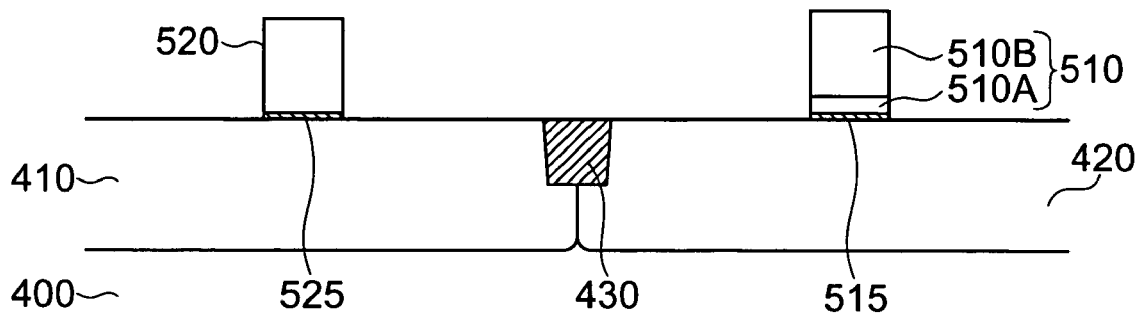
FIG. 18 is a longitudinal sectional view showing the sectional structure of a device in a process of the CMOSFET fabrication method.

As shown in FIG. 18, a photoresist step, RIE (Reactive Ion Etching) step, and the like are executed to form a gate electrode 510 made up of a polysilicon germanium (SiGe) film 510A and polysilicon (Si) film 510B and a gate insulating film 515 on the N-type semiconductor region 420, and a gate electrode 520 made of a polysilicon germanium (SiGe) film and a gate insulating film 525 on the P-type semiconductor region 410.

Figure 19:
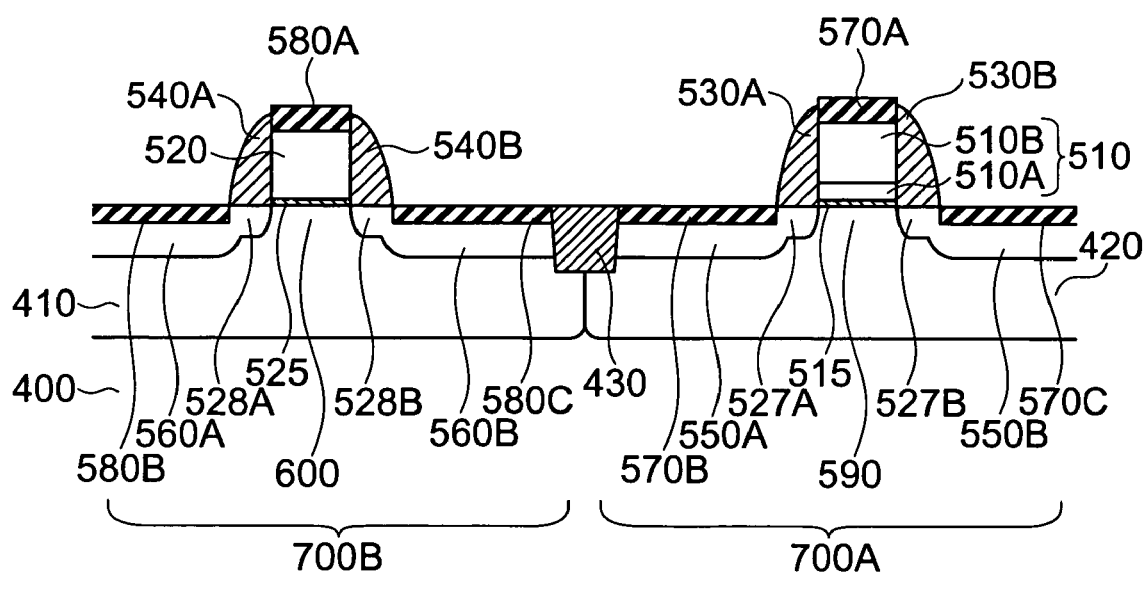
FIG. 19 is a longitudinal sectional view showing the sectional structure of a device in a process of the CMOSFET fabrication method.

As shown in FIG. 19, on the N-type semiconductor region 420, a P-type dopant such as boron (B) is ion-implanted, and annealing is performed to diffuse this boron (B), thereby forming a lightly doped source extension region 527A and drain extension region 527B having shallow junctions.

In addition, on the P-type semiconductor region 410, an N-type dopant such as phosphorus (P) is ion-implanted, and annealing is performed to diffuse this phosphorus (P), thereby forming a lightly doped source extension region 528A and drain extension region 528B having shallow junctions.

Gate electrode side walls 530A and 530B are formed on the side surfaces of the gate electrode 510, and gate electrode side walls 540A and 540B are formed on the side surfaces of the gate electrode 520.

Subsequently, on the N-type semiconductor region 420, a P-type dopant such as boron (B) is ion-implanted, and annealing is performed to diffuse this boron (B), thereby activating the boron (B) ion-implanted into the gate electrode 510, and forming a source region 550A and drain region 550B.

In addition, on the P-type semiconductor region 410, an N-type dopant such as phosphorus (P) is ion-implanted, and annealing is performed to diffuse this phosphorus (P), thereby activating the phosphorus (P) ion-implanted into the gate electrode 520, and forming a source region 560A and drain region 560B.

Then, a metal film made of, e.g., nickel (Ni) or platinum (pt) is formed by sputtering. After that, annealing is performed to form silicides 570A to 570C for reducing the parasitic resistance on the surface of the gate electrode 510 and in the surface portions of the source region 550A and drain region 550B, and form silicides 580A to 580C on the surface of the gate electrode 520 and in the surface portions of the source region 560A and drain region 560B.

Subsequently, an interlayer dielectric film (not shown) is formed, and an interconnection step is performed by forming a contact plug (not shown) in this interlayer dielectric film, thereby forming a CMOSFET 700 including a PMOSFET 700A and NMOSFET 700B.

As shown in FIG. 19, in the CMOSFET 700 fabricated by the above method, the element isolation oxide film 430 for element isolation is formed in the surface portion of the semiconductor substrate 400. Near the central portion of the N-type semiconductor region 420 isolated by the element isolation oxide film 430, the gate electrode 510 made up of the polysilicon germanium (SiGe) film 510A and polysilicon (Si) film 510B is formed via the gate insulating film 515 formed on the surface of the semiconductor substrate 400.

On the side surfaces of the gate electrode 510, the gate electrode side walls 530A and 530B as insulating films are formed. Also, a channel region 590 in which an electric current flows is formed near the surface of the semiconductor substrate 400 below the gate electrode 510.

The source region 550A is formed between the channel region 590 and element isolation oxide film 430, and the drain region 550B is formed between the channel region 590 and an element isolation oxide film (not shown).

In addition, the suicides 570A to 570C for reducing the parasitic resistance are formed on the surface of the gate electrode 510 and on the surfaces of the source region 550A and drain region 550B.

On the other hand, near the central portion of the P-type semiconductor region 410, the gate electrode 520 made of the polysilicon (Si) film is formed via the gate insulating film 525 formed on the surface of the semiconductor substrate 400.

On the side surfaces of the gate electrode 520, the gate electrode side walls 540A and 540B as insulating films are formed. Also, a channel region 600 in which an electric current flows is formed near the surface of the semiconductor substrate 400 below the gate electrode 520.

The source region 560A is formed between the channel region 600 and an element isolation oxide film (not shown), and the drain region 560B is formed between the channel region 600 and the element isolation oxide film 430. In addition, the silicides 580A to 580C are formed on the surface of the gate electrode 520 and on the surfaces of the source region 560A and drain region 560B.

In this embodiment as described above, a silicon germanium (SiGe) film having a high germanium (Ge) concentration and a small film thickness can be formed with a good morphology on the gate insulating film 450.

When the CMOSFET 700 is formed, therefore, it is possible to form the gate electrode 510 made up of the polysilicon germanium (SiGe) film 510A and polysilicon (Si) film 510B in the PMOSFET 700A, and the gate electrode 520 made of the polysilicon (Si) film in the NMOSFET 700B, without increasing the difference between the heights of the gate electrode 510 in the PMOSFET 700A and the gate electrode 520 in the NMOSFET 700B. As a consequence, the inability to fabricate these gate electrodes can be avoided.

(3) OTHER EMBODIMENTS

Note that the above embodiments are merely examples and do not limit the present invention. For example, silicon carbon (Si:C) as a solid solution may also be used instead of silicon (Si) used in the polysilicon germanium (SiGe) films 150 and 460 and polysilicon (Si) films 180 and 500. In this case, it is possible to first form a polycrystalline silicon germanium carbon (SiGe:C) film having a low germanium (Ge) concentration and a large film thickness, and then form a polycrystalline silicon germanium carbon (SiGe:C) film having a high germanium (Ge) concentration and a small film thickness on a gate insulating film by preferentially oxidizing silicon carbon (Si:C) of the former polycrystalline carbon germanium (SiGe:C) film.

The above embodiments can suppress depletion of the gate electrode, and prevent an increase in resistance of a silicide.

What is claimed is:

1. A semiconductor device comprising:
    a gate insulating film selectively formed on a predetermined region of a semiconductor substrate;
    a gate electrode comprising a first film formed on said gate insulating film and containing a predetermined semiconductor material and germanium, and a second film formed on said first film, containing the semiconductor material, and having a germanium concentration lower than that of said first film; and
    a source region and drain region formed in a surface portion of said semiconductor substrate on two sides of a channel region positioned below said gate electrode,
    wherein the semiconductor material is one of silicon and carbon.

2. A device according to claim 1, wherein said second film is made of the semiconductor material.

3. A device according to claim 1, wherein:
    in a surface portion of said semiconductor substrate, a first-conductivity-type semiconductor region and a second-conductivity-type semiconductor region are formed,
    said gate insulating film includes a first gate insulating film formed on the second-conductivity-type semiconductor region, and a second gate insulating film formed on the first-conductivity-type semiconductor region;
    said gate electrode includes a first gate electrode comprising a first film formed on said first gate insulating film and containing a predetermined semiconductor material and germanium, and a second film formed on said first film, containing the semiconductor material, and having a germanium concentration lower than that of said first film, and a second gate electrode made of said second film formed on said second gate insulating film;
    said source region and drain region includes a first source region and first drain region formed in a surface portion of the second-conductivity-type semiconductor region on two sides of a first channel region positioned below said first gate electrode, and a second source region and second drain region formed in a surface portion of the first-conductivity-type semiconductor region on two sides of a second channel region positioned below said second gate electrode; and
    said second film is made of the semiconductor material, and the semiconductor material is one of silicon and carbon.

4. A semiconductor device fabrication method comprising:

forming a gate insulating film on a semiconductor substrate;

forming a film containing a predetermined semiconductor material and germanium on the gate insulating film;

oxidizing the film to form a first film having a germanium concentration higher than that of the film and a film thickness smaller than that of the film on the gate insulating film, and forming an oxide film on the first film;

removing the oxide film;

forming, on the first film, a second film containing the semiconductor material and having a germanium concentration lower than that of the first film;

forming a gate electrode by etching the second and first films; and forming a source region and drain region by ion-implanting a predetermined impurity by using the gate electrode as a mask, wherein when the first film and oxide film are to be formed, selective oxidation which oxidizes the semiconductor material in preference to the germanium is performed in a gas system containing an oxidizer and reducer, by setting a partial pressure ratio of the oxidizer to the reducer and a temperature of the gas system within a range over which the semiconductor material oxidizes in preference to the germanium, and the oxidizer contains at least one of steam, carbon dioxide, and oxygen, and the reducer contains at least one of hydrogen and carbon monoxide.

5. A method according to claim 1, wherein when the first film is to be formed, thermal oxidation by which an oxidation rate of the semiconductor material is higher than that of the germanium is performed in a gas system containing an oxidizer and reducer, by setting a partial pressure ratio of the oxidizer to the reducer and a temperature of the gas system within a range over which both the semiconductor material and germanium oxidize.

6. A method according to claim 1, wherein when the second film is to be formed, a second film made of the semiconductor material is formed on the first film.

7. A method according to claim 1, wherein the semiconductor material is one of silicon and carbon.

8. A semiconductor device fabrication method comprising:

forming a first-conductivity-type semiconductor region and second-conductivity-type semiconductor region in a surface portion of a semiconductor substrate;

forming a gate insulating film on the semiconductor substrate;

forming a film containing a predetermined semiconductor material and germanium on the gate insulating film;

oxidizing the film to form a first film having a germanium concentration higher than that of the film and a film thickness smaller than that of the film on the gate insulating film, and forming an oxide film on the first film;

removing the oxide film;

forming a mask pattern having a pattern corresponding to the second-conductivity-type semiconductor region, and etching the first film by using the mask pattern, thereby removing the first film formed on the first-conductivity-type semiconductor region via the gate insulating film;

removing the mask pattern, and forming a second film containing the semiconductor material and having a germanium concentration lower than that of the first film, on the gate insulating film formed on the first-conductivity-type semiconductor region, and on the first film formed on the second-conductivity-type semiconductor region;

forming a first gate electrode by etching the second and first films formed on the second-conductivity-type semiconductor region, and forming a second gate electrode by etching the second film formed on the first-conductivity-type semiconductor region; and forming a first source region and first drain region by ion-implanting a first-conductivity-type impurity in the second-conductivity-type semiconductor region by using the first gate electrode as a mask, and forming a second source region and second drain region by ion-implanting a second-conductivity-type impurity in the first-conductivity-type semiconductor region by using the second gate electrode as a mask, wherein when the first film is formed, selective oxidation which oxidizes the semiconductor material in preference to the germanium is performed in a gas system containing an oxidizer and reducer, by setting a partial pressure ratio of the oxidizer to the reducer and a temperature of the gas system within a range over which the semiconductor material oxidizes in preference to the germanium, and the oxidizer contains at least one of steam, carbon dioxide, and oxygen, and the reducer contains at least one of hydrogen and carbon monoxide.

9. A method according to claim 8, wherein when the first film is to be formed, thermal oxidation by which an oxidation rate of the semiconductor material is higher than that of the germanium is performed in a gas system containing an oxidizer and reducer, by setting a partial pressure ratio of the oxidizer to the reducer and a temperature of the gas system within a range over which both the semiconductor material and germanium oxidize.

10. A method according to claim 8, wherein when the second film is to be formed, a second film made of the semiconductor material is formed on the first film.

11. A method according to claim 8, wherein the semiconductor material is one of silicon and carbon.

* * * * *